US009608200B2

(12) United States Patent
Shen et al.

(10) Patent No.: US 9,608,200 B2
(45) Date of Patent: Mar. 28, 2017

(54) HYBRID METALLIC HARD MASK STACK FOR MTJ ETCHING

(71) Applicant: Headway Technologies, Inc., Milpitas, CA (US)

(72) Inventors: Dongna Shen, San Jose, CA (US); Yu-Jen Wang, San Jose, CA (US); Tom Zhong, Saratoga, CA (US)

(73) Assignee: Headway Technologies, Inc., Milpitas, CA (US)

(*) Notice: Subject to any disclaimer, the term of this patent is extended or adjusted under 35 U.S.C. 154(b) by 45 days.

(21) Appl. No.: 14/670,596

(22) Filed: Mar. 27, 2015

(65) Prior Publication Data
US 2016/0284985 A1    Sep. 29, 2016

(51) Int. Cl.
*H01L 21/00* (2006.01)
*H01L 43/12* (2006.01)

(52) U.S. Cl.
CPC ................................. *H01L 43/12* (2013.01)

(58) Field of Classification Search
CPC .................................. H01L 43/12; H01L 43/00
See application file for complete search history.

(56) References Cited

U.S. PATENT DOCUMENTS

| 7,001,783 | B2 | 2/2006 | Costrini et al. |
| 8,133,745 | B2 | 3/2012 | Zhong et al. |
| 8,324,698 | B2 | 12/2012 | Zhong et al. |
| 8,722,543 | B2 | 5/2014 | Belen et al. |
| 8,962,349 | B1* | 2/2015 | Chen ............... H01L 43/12 257/421 |
| 8,975,089 | B1* | 3/2015 | Jung ............... H01L 43/12 257/295 |
| 9,166,154 | B2* | 10/2015 | Satoh ............. H01L 43/12 |
| 2012/0028373 | A1 | 2/2012 | Belen et al. |

\* cited by examiner

*Primary Examiner* — Richard Booth
(74) *Attorney, Agent, or Firm* — Saile Ackerman LLC; Stephen B. Ackerman; Rosemary L. S. Pike

(57) ABSTRACT

A hard mask stack for etching a magnetic tunneling junction (MTJ) structure is described. The hard mask stack is formed on a stack of MTJ layers on a bottom electrode and comprises an electrode layer on the MTJ stack, a buffer metal layer on the electrode layer, a metal hard mask layer on the buffer metal layer, and a dielectric layer on the metal hard mask layer wherein a dielectric mask is defined in the dielectric layer by a photoresist mask, a metal hard mask is defined in the metal hard mask layer by the dielectric mask, a buffer metal mask is defined in the buffer metal layer by the metal hard mask, an electrode mask is defined in the electrode layer by the buffer metal mask, and the MTJ structure is defined by the electrode mask wherein the electrode mask remaining acts as a top electrode.

6 Claims, 2 Drawing Sheets

HYBRID METALLIC HARD MASK STACK FOR MTJ ETCHING

TECHNICAL FIELD

This application relates to the general field of magnetic tunneling junctions (MTJ) and, more particularly, to etching methods for forming MTJ structures.

BACKGROUND

Ta is one of the best hard masks for MTJ reactive ion etching (RIE) due to a very low etching rate using Methanol and high etching selectivity to MTJ materials. Usually, a Ta hard mask is patterned by a dielectric hard mask, for example, $SiO_2$, SiN, APF (advanced patterning film), etc., and the dielectric hard mask is patterned by photoresist (PR). This is because there will be a fencing issue if PR is used directly to pattern Ta. Serving as the MTJ etching hard mask and top electrode, we need Ta to be thicker than about 38 nm. However, we always need to balance between high selectivity for both $PR/SiO_2$ and $Ta/SiO_2$, and sidewall striation, which usually happens during high selectivity etching schemes and results in non-uniform MTJ devices.

Several patents show the use of various hard masks in etching MTJ stacks. These include U.S. Pat. No. 8,722,543 (Belen et al), U.S. Pat. No. 8,324,698 (Zhong et al), U.S. Pat. No. 8,133,745 (Zhong et al), and U.S. Pat. No. 7,001,783 (Costrini et al) and US Patent Application 2012/0028373 (Belen et al).

SUMMARY

It is an object of the present disclosure to provide a hard mask and an etching scheme to improve etching uniformity in forming MTJ structures.

It is a further object of the present disclosure to provide a hard mask and etching scheme for MTJ structures which can be beneficial for smaller critical dimension (CD) sizes.

Yet another object of the present disclosure is to provide a hard mask and etching scheme for MTJ structures wherein a thick Ta layer remains as a top electrode without increasing the thickness of other hard mask layers.

In accordance with the objectives of the present disclosure, a hard mask stack for etching a magnetic tunneling junction (MTJ) structure is achieved. The hard mask stack is formed on a stack of MTJ layers on a bottom electrode. The hard mask stack comprises an electrode layer on the MTJ stack, a buffer metal layer on the electrode layer, a metal hard mask layer on the buffer metal layer, and a dielectric layer on the metal hard mask layer wherein a dielectric mask is defined in the dielectric layer by a photoresist mask, a metal hard mask is defined in the metal hard mask layer by the dielectric mask, a buffer metal mask is defined in the buffer metal layer by the metal hard mask, an electrode mask is defined in the electrode layer by the buffer metal mask, and the MTJ structure is defined by the electrode mask wherein the electrode mask remaining after the MTJ structure is defined acts as a top electrode.

Also accordance with the objectives of the present disclosure, a method for etching a magnetic tunneling junction (MTJ) structure is achieved. A stack of MTJ layers is provided on a bottom electrode. An electrode layer is deposited on the stack of MTJ layers. A buffer metal layer is deposited on the electrode layer. A metal hard mask layer is deposited on the buffer metal layer. A dielectric layer is deposited on the metal hard mask layer. A photoresist mask is formed on the dielectric layer. The dielectric layer is etched away where it is not covered by the photoresist mask to form a dielectric mask. The metal hard mask layer is etched using the dielectric mask to form a metal hard mask. The buffer metal layer is etched using the metal hard mask to form a buffer metal mask. The electrode layer is etched using the buffer metal mask to form an electrode mask. The MTJ structure is etched using the electrode mask. The electrode mask remaining acts as a top electrode.

BRIEF DESCRIPTION OF THE DRAWINGS

In the accompanying drawings forming a material part of this description, there is shown.

DETAILED DESCRIPTION

Figure 1:
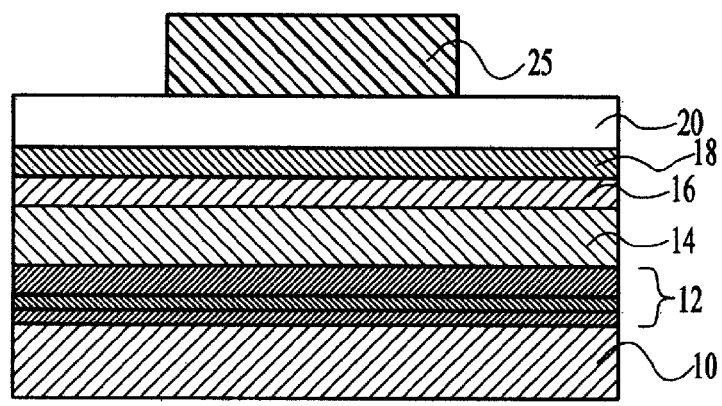
FIGS. 1 through 7 illustrate in cross-sectional representation steps in a preferred embodiment of the present disclosure.

The present disclosure provides a method of manufacturing the STT-RAM based on a new hybrid metallic hard mask design with Ta/Buffer Metal (PtMn or Ni)/Ta. This method can improve etching uniformity within wafers and within chips because of much higher etching selectivity of Ta/PtMn or Ta/Ni in the hard mask opening process using $CF_4$. This method can perform etching by using thinner $SiO_2$/photoresist masks, which can be beneficial for smaller CD size. This method can also generate thick Ta remaining as the top electrode without increasing the thickness of $SiO_2$ or PR. Thick Ta is required for ion beam etching (IBE) due to poor selectivity of IBE.

Table 1 illustrates the etch rate in nanometers per minute for several hard mask materials in $CF_4$ and in $CH_3OH$. Table 2 illustrates the etch selectivity of pairs of hard mask materials.

TABLE 1

Etch Rate of Different MTJ Etch Mask Materials.

| Material | Etch Rate (nm/min) in $CF_4$ | Etch Rate (nm/min) in $CH_3OH$ |
| --- | --- | --- |
| PR | 203.40 | NA |
| Ta | 83.4 | 4.10 |
| PtMn | 2.40 | 45.12 |
| Ni | 1.85 | 50.95 |
| $SiO_2$ | 126.00 | 26.70 |
| Cu | 1.6 | 135.7 |
| Co | 2.1 | 21.89 |
| Ni | 1.85 | 50.95 |
| NiCr | 3.2 | 15.9 |
| Fe | 1.31 | 6.26 |
| NiFe | 2.2 | 63.7 |
| CoFe | 1.8 | 40.9 |
| CoFeB | 1.8 | 27.2 |
| Mg | 0.8 | 8.3 |
| Ru | 6.5 | 37.7 |

TABLE 2

Etching Selectivity of Different MTJ Etch mask Materials

| Materials | Etch Selectivity |
| --- | --- |
| $SiO_2$/PR ($CF_4$) | 0.62 |
| Ta/$SiO_2$ ($CF_4$) | 0.66 |
| PtMn/Ta ($CH_3OH$) | 11.00 |
| Ni/Ta ($CH_3OH$) | 12.43 |

TABLE 2-continued

Etching Selectivity of Different MTJ Etch mask Materials

| Materials | Etch Selectivity |
|---|---|
| Ta/PtMn (CF$_4$) | 34.75 |
| Ta/Ni (CF$_4$) | 45.08 |

One old MTJ etching mask stack was Ta/SiO$_2$/PR, in which Ta was also used for the top electrode of the MTJ. SiO$_2$ was defined by PR and etched by CF$_4$; Ta was defined by SiO$_2$ and etched by CF$_4$; and then the remaining Ta was used as the MTJ etching mask and the top electrode after the MTJ etch.

This MTJ etch using Ta/SiO$_2$/PR masks has worse selectivity for SiO$_2$/PR and Ta/SiO$_2$, as shown in the tables. To have enough thickness of Ta remaining after the MTJ etching as the top electrode, thick Ta is required. To obtain thick Ta, thick SiO$_2$ and PR are required. However, it will be difficult to print small CD using thick PR. The uniformity will be bad when either PR or SiO$_2$ has not enough thickness for the thick Ta. If a high SiO$_2$/PR selectivity etch scheme is chosen, using different chemicals to etch the hard mask SiO$_2$ and Ta, the sidewall striation results in rough sidewalls of devices and large variation of the device performance.

A new MTJ etching mask stack is described and shown in the present disclosure. The new MTJ etching mask stack is Ta1/Buffer Metal (PtMn or Ni)/Ta2/dielectric/PR, in which Ta1 is also used for the top electrode of the MTJ. The dielectric may be SiO$_2$, SiN, or APF, for example, but SiO$_2$ is preferred and will be used in this description. The SiO$_2$ is defined by PR and etched by CF$_4$; Ta2 is defined by SiO$_2$ and etched by CF$_4$; buffer metal, preferably PtMn or Ni, is defined by Ta2 and etched by CH$_3$OH; Ta1 is defined by the buffer metal and etched by CF$_4$; and Ta1 is then used as the MTJ etching mask and the top electrode after the MTJ etch. The MTJ etch process flow is shown in FIGS. 1 through 7.

Referring now more particularly to FIG. 1, an MTJ stack 12 is formed on a bottom electrode 10. Next, the hard mask stack of the present disclosure is formed. First a layer of Ta, or alternately TaN, Ti, or TiN, or the like, is deposited on the MTJ stack. This first Ta layer or electrode layer 14 should have a thickness of between about 380 and 1000 Angstroms. Next, a buffer metal layer 16 is deposited on the first Ta layer. This may be PtMn, Ni, Cu, Mg, Ru, NiCr, NiFe, CoFeB, or CoFe alloy or any material that has a good selectivity to Ta, having a thickness of between about 50 and 500 Angstroms. A second Ta layer, or alternately TaN, Ti, or TiN, metal hard mask layer 18 is formed on the buffer metal layer 16 to a thickness of between about 50 and 300 Angstroms, followed by a SiO$_2$ layer 20 having a thickness of between about 400 and 900 Angstroms. A photoresist layer is deposited and patterned to form photoresist mask 25.

Figure 2:
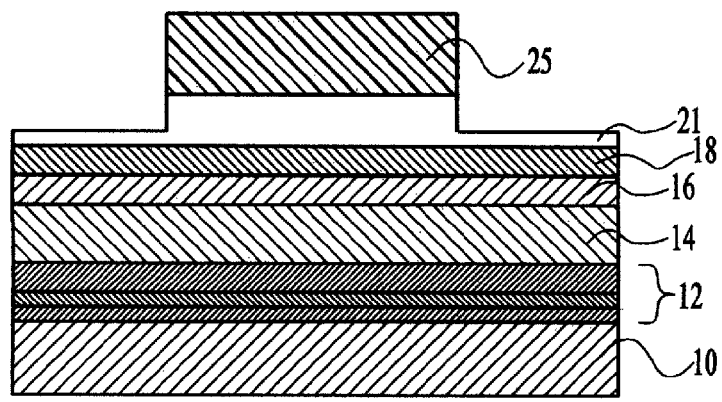
Figure 3:
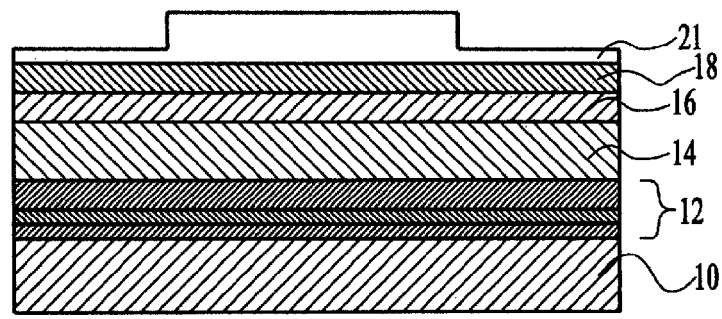
Figure 4:
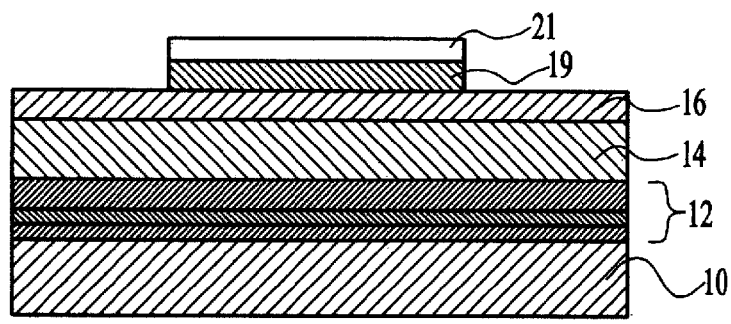
Figure 5:
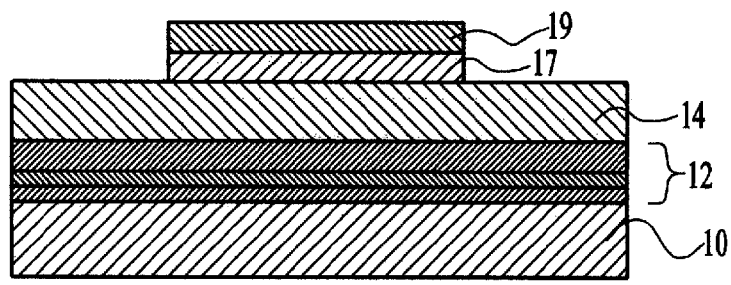

Now, referring to FIG. 2, the SiO$_2$ layer is etched where it is not covered by the PR mask using fluoride-based chemicals, such as CF$_4$. The PR mask is removed, as shown in FIG. 3, to form SiO$_2$ hard mask 21. Now, a metal hard mask 19 is defined by the SiO$_2$ hard mask 21 and etched by fluoride-based chemicals, such as CF$_4$; as shown in FIG. 4. The buffer metal layer 16, preferably PtMn or Ni, is etched using the remaining SiO$_2$ hard mask 21 and the metal hard mask 19 as the etching mask, leaving buffer metal layer mask 17, as shown in FIG. 5. This etch is performed using CH$_3$OH-based chemicals or CO and NH$_3$-based chemicals. For example, the etchant can be CH$_3$OH or CH$_3$OH with other gases such as Ar, O$_2$, H$_2$, N$_2$, and so on.

Figure 6:
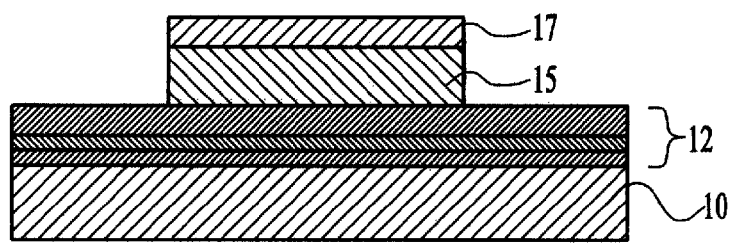
Figure 7:
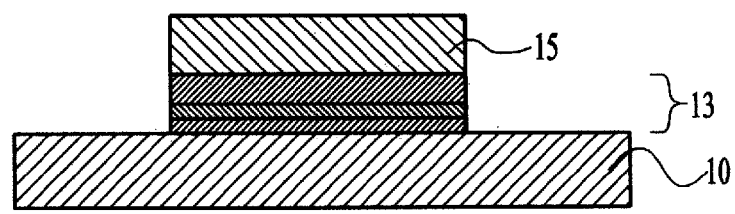

The metal hard mask 19 and the buffer layer mask 17 are used to define the electrode mask layer 15, etching by fluoride-based chemicals, such as CF$_4$. The resulting electrode mask layer 15 is shown in FIG. 6. The remaining hard mask layer 19 is etched away during this etch. Referring now to FIG. 7, electrode mask 15 is used as the MTJ etching mask to form the MTJ structure 13, etching by CH$_3$OH-based chemicals or CO and NH$_3$-based chemicals. The remaining electrode mask 15 is used as the top electrode.

The MTJ etching scheme according to the present disclosure has much higher etch selectivity and much better uniformity within the wafer and within the chip. This etching scheme can utilize thinner SiO$_2$/PR but generate thicker remaining Ta for a larger CMP process window, and leave enough thickness of Ta (or TaN, Ti, or TiN) as the top electrode of the MTJ, which will be also beneficial for smaller CD. For example, the remaining Ta can be more than 600 Angstroms thicker than the old method and the SiO$_2$/PR can be as much as 500 Angstroms thinner.

The much thicker Ta is also necessary if the MTJ is to be etched by ion beam etching (IBE) due to a very low selectivity of MTJ layers to Ta in IBE. Additionally, a much thinner PR (less than about 500 to 3600 A, or up to half as thick as previously) is required to meet the resolution criteria for the next generation lithography. A much thicker Ta top electrode can be achieved by RIE also using this hybrid hard mask stack. For that reason, a much thinner oxide combining with our new hybrid hard mask design will be necessary for the sub-nano technology node (with critical dimensions in the 45/28/20 nm neighborhood).

Although the preferred embodiment of the present disclosure has been illustrated, and that form has been described in detail, it will be readily understood by those skilled in the art that various modifications may be made therein without departing from the spirit of the disclosure or from the scope of the appended claims.

What is claimed is:

1. A hard mask stack for etching a magnetic tunneling junction (MTJ) structure comprising:
    an electrode layer on a stack of MTJ layers on a bottom electrode;
    a buffer metal layer on said electrode layer;
    a metal hard mask layer on said buffer metal layer; and
    a dielectric layer on said metal hard mask layer
   wherein a dielectric mask is defined in said dielectric layer by a photoresist mask, a metal hard mask is defined in said metal hard mask layer by said dielectric mask, a buffer metal mask is defined in said buffer metal layer by said metal hard mask, an electrode mask is defined in said electrode layer by said buffer metal mask, and said MTJ structure is defined by said electrode mask wherein said electrode mask remaining after said MTJ structure is defined acts as a top electrode.

2. The hard mask stack according to claim 1 wherein said electrode layer comprises Ta, TaN, Ti, or TiN having a thickness of between about 380 and 1000 Angstroms.

3. The hard mask stack according to claim 1 wherein said buffer metal layer comprises PtMn, Ni, Cu, Mg, Ru, NiCr, NiFe, CoFeB, or CoFe alloy, having a thickness of between about 50 and 500 Angstroms.

4. The hard mask stack according to claim 1 wherein said metal hard mask layer comprises Ta, TaN, Ti, or TiN and has a thickness of between about 50 and 300 Angstroms.

5. The hard mask stack according to claim 1 wherein said dielectric layer comprises SiO$_2$, SiN, or advanced patterning film having a thickness of between about 400 and 900 Angstroms.

6. The hard mask stack according to claim 1, wherein said photoresist mask has a thickness of less than about 500 to 3600 Angstroms.

\* \* \* \* \*